United States Patent
Onitsuka

[11] Patent Number: 5,839,645
[45] Date of Patent: Nov. 24, 1998

[54] BONDING MACHINE OF ELECTRONIC COMPONENTS AND BONDING METHOD THEREOF

[75] Inventor: Yasuto Onitsuka, Fukuoka, Japan

[73] Assignee: Matsushita Electric Industrial Co., Ltd., Osaka, Japan

[21] Appl. No.: 718,974

[22] Filed: Sep. 26, 1996

[30] Foreign Application Priority Data

Sep. 29, 1995 [JP] Japan .................................. 7-253192

[51] Int. Cl.⁶ .................................................. B23K 31/02
[52] U.S. Cl. ................... 228/180.22; 228/6.2; 228/44.7; 228/49.5
[58] Field of Search ................ 228/180.22, 180.21, 228/6.2, 44.7, 49.5

[56] References Cited

U.S. PATENT DOCUMENTS 3,357,621  12/1967  Badini et al. ............................ 228/49.5
5,579,985  12/1996  Ichikawa ............................. 228/180.22

FOREIGN PATENT DOCUMENTS 63-95631   4/1988  Japan ....................................... 228/6.2
63-220531  9/1988  Japan ...................................... 228/44.7
3-97239    4/1991  Japan ................................. 228/180.22

Primary Examiner—Patrick Ryan
Assistant Examiner—Jeffrey T. Knapp
Attorney, Agent, or Firm—Ratner & Prestia

[57] ABSTRACT

A bonding machine bonds electronic components to a substrate and makes it possible to prevent the breakage of wires from occurring without use of slip rings. A first terminal is connected to a thermal pressing head through a wire and is installed on a rotating member. A second terminal is connected to an electric power supply through a wire and is installed below the rotating member. The first terminal and second terminal contact only when electric current is supplied to the thermal pressing head. Both contacts are separated when the thermal pressing head releases the electronic component and is moved away from the substrate.

7 Claims, 5 Drawing Sheets

BONDING MACHINE OF ELECTRONIC COMPONENTS AND BONDING METHOD THEREOF

II. BACKGROUND OF THE INVENTION

The present invention relates to a bonding machine used in mounting electronic components on a substrate and a bonding method using the bonding machine.

One of the bonding machines that are used in bonding electronic components on a substrate by heating solder bumps provided in advance on electronic components and pressing down the electronic components on the substrate for connection is a type of machine wherein a means for thermal pressing such as a thermal pressing head or the like is provided on the periphery of a rotating member. In the bonding machine of this type, an electronic component is picked up by a thermal pressing head at a specified rotational position of a rotating member, which is rotated so that the picked electronic component is positioned above a specified place of a substrate where the electronic component is mounted. Then, an electric power is supplied to the thermal pressing head through wires from an external power supply and a thermal pressing process takes place to bond the electronic component on the substrate. A direct connection between the power supply and the thermal pressing head by wires causes the wires to be twisted and broken when the rotating member is rotated. To prevent this, a slip ring and a brush that slide by rotation against each other are provided between the power supply and the thermal pressing head.

However, such a bonding machine like this is installed in an environment such as a clean room where dusts and dirts are eliminated very strictly and small particles produced by rotational sliding of the slip ring and brush against each other cause environmental contamination. On the other hand, when a pulse heater requiring a large electric current is employed in the means for thermal pressing such as a thermal pressing head and the like, a sticking due to melting between a slip ring and a brush is likely to occur and so the magnitude of the electric current to be fed to the means for thermal pressing is restricted, thereby making it difficult to feed the required large electric current. Furthermore, a bonding machine usually has vacuum channels in addition to electric wiring and places, where the vacuum channels are installed, are often restricted by the existence of a slip ring, thus reducing the freedom in designing the bonding machine. These problems multiply as the number of the means for thermal pressing installed on the periphery of the rotating member increases, thereby developing into more serious problems.

III. SUMMARY OF THE INVENTION

The present invention provides a bonding machine of electronic components and a bonding method whereby breakage of wires and environmental contamination can be prevented from occurring.

The bonding machine of electronic components of the present invention comprises:

- a substrate positioning means for fixing the position of a substrate;
- a plurality of processing means whereby electronic components are mounted on a substrate upon receipt of electric power;
- a rotating member holding the foregoing plurality of processing means in a radiating pattern arrangement;
- a driving means whereby the rotating member is rotated to have a certain processing means, which has been pre-selected from the plurality of processing means, positioned above a specific place of a substrate;
- a plurality of first terminals, each of which is arranged on the rotating member so as to correspond in position to each of the processing means and also is connected electrically with each respective corresponding processing means;
- a second terminal which is connected to an electric power supply and held independently from the rotating member and which is positioned opposite to each respective first terminal; and
- a switching means for connecting and separating electrically each respective first terminal to and from the second terminal.

It is preferred that each of the processing means of this bonding machine includes a thermal pressing head having a thermal pressing tool.

The bonding method of the present invention comprises the steps of:

- holding an electronic component by a thermal pressing head having a thermal pressing tool;
- moving the thermal pressing head towards the above of a substrate and moving a first terminal connected electrically to the thermal pressing tool to a position where the first terminal can come into contact with a second terminal;
- bringing the first terminal and second terminal into contact with each other and making the thermal pressing tool generate heat through a supply of electric power from an electric power supply connected to the second terminal to the thermal pressing tool;
- pressing thermally the electronic component on the substrate by means of the thermal pressing tool;
- separating the second terminal from the first terminal; and moving the thermal pressing head away from the above of the substrate.

According to the foregoing structures, there will not be any breakage of wires due to twisting by rotation since the wires from the power supply to the processing means are divided into two sections, one from the power supply to the second terminal and the other from the first terminals to the processing means. Further, a structure, wherein the first terminals and the second terminal come into contact with each other only when the electric current is flowing therein and do not come into contact with each other when they are in rotary motion, is employed and no dusts are produced due to rotational sliding of brushes and there is no limitation imposed on the amount of electric currents, either. In addition, since there are no wires installed on the rotating member to connect to the power supply, any interference with vacuum channels and other systems hardly takes place, thus providing much freedom in designing the bonding machine.

IV. BRIEF DESCRIPTION OF THE DRAWINGS

V. DESCRIPTION OF THE PREFERRED EMBODIMENTS

A first exemplary embodiment of the present invention will be explained with reference to FIG. 1 to FIG. 4. The first exemplary embodiment is a bonding machine for thermal pressing on a substrate a plurality of solder bumps provided on the bottom surface of a flip chip device.

Figure 1:
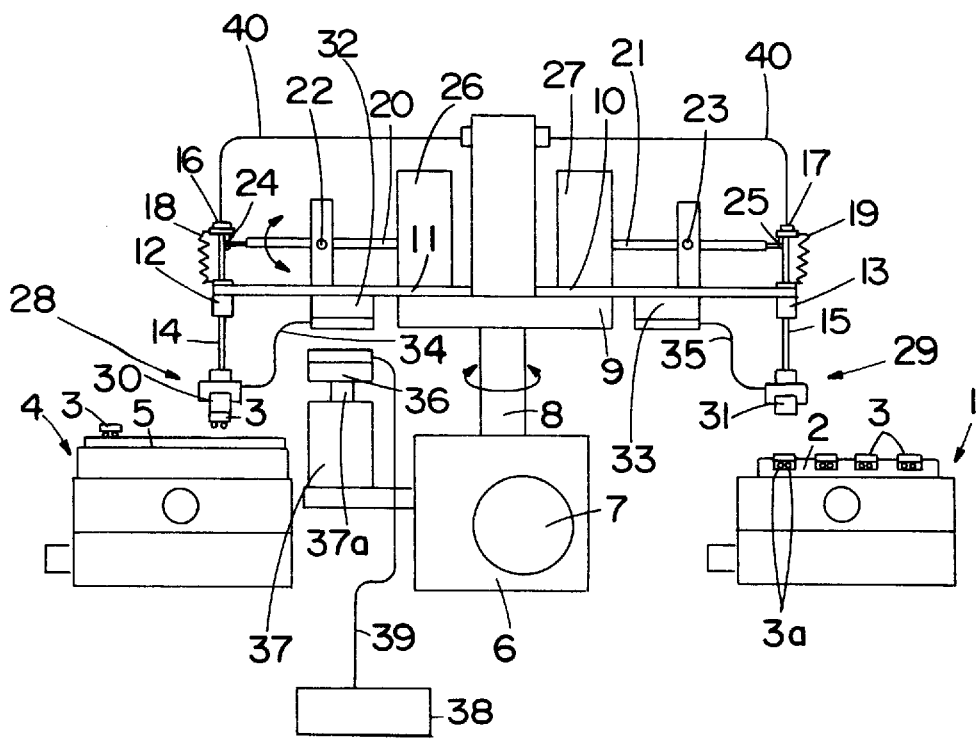
FIG. 1 is a side view of a bonding machine in a first exemplary embodiment of the present invention.

In the bonding machine of FIG. 1, a tray 2 containing flip chip devices 3 is aligned in X and Y directions by a tray positioning means 1 and a substrate 5, on which the flip chip devices 3 are to be mounted, is fixed in position by a substrate positioning means 4. On the bottom surface of each respective flip chip device 3 are provided solder bumps 3a to be thermal pressed on the substrate 5. The tray positioning means 1 and the substrate positioning means 4 are arranged at the positions separated from each other, and an index mechanism 6 is arranged between both means of above. The index mechanism 6 includes a motor 7 and a shaft 8, which is rotated by the rotational force of the motor 7. A turntable 9 is attached to the shaft 8 and the turn table 9 is provided with radially extended arms 10 and 11.

On the tip ends of the arms 10 and 11 are fixed guides 12 and 13, respectively. Up-and-down rods 14 and 15, which are movable vertically, are inserted in the guides 12 and 13, respectively. Flanges 16 and 17 are fixed on the upper ends of the up-and-down rods 14 and 15, and springs 18 and 19 are arranged between the flanges 16 and 17 and the arms 11 and 10, respectively.

Levers 20 and 21, on the tip ends of which hitting members 24 and 25 to hit the flanges 16 and 17 are provided, are supported in the centers thereof by supporting members 22 and 23, respectively, so that the levers 20 and 21 can swing freely. The levers 20 and 21 are made to swing by driving members 26 and 27 installed on the arms 11 and 10, respectively.

On the lower ends of the up-and-down rods 14 and 15 are attached thermal pressing heads 28 and 29 serving as processing means for mounting electronic components on a substrate, respectively. The thermal pressing heads 28 and 29 are provided with thermal pressing tools 30 and 31, respectively, whereby the flip chip devices 3 are picked by sucking and the solder bumps 3a are thermal pressed on the substrate 5. Furthermore, the thermal pressing tools 30 and 31 are moved up and down by the swinging of the levers 20 and 21 that are activated by the driving members 26 and 27, respectively. In addition, the temperatures of the thermal pressing tools 30 and 31 are raised due to the heat generated by the internal resistance thereof when electric power is fed thereto.

Figure 2:
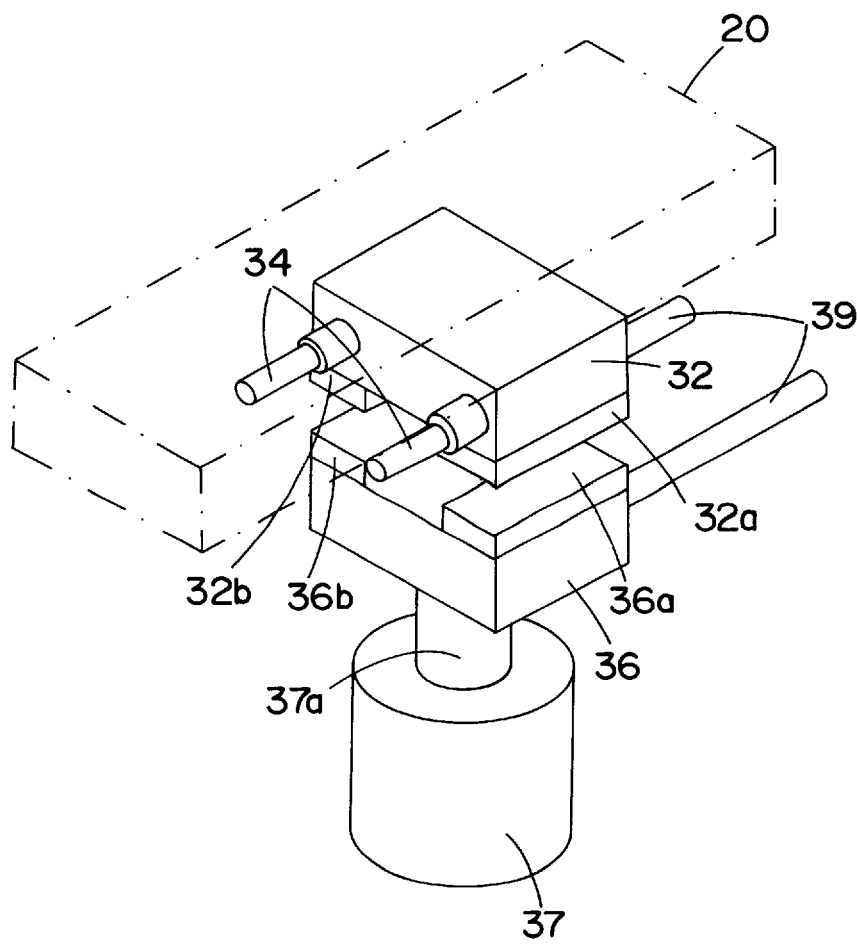
FIG. 2 is a perspective view of first terminals and a second terminal for the bonding machine of FIG. 1.

First terminals 32 and 33 that correspond to the thermal pressing tools 30 and 31 are fixed on the bottom surfaces of the arms 11 and 10, respectively. The thermal pressing tools 30 and 31 are connected electrically to the first terminals 32 and 33 by first wires 34 and 35, respectively. A second terminal 36 is arranged directly below the first terminal 32 that corresponds to the thermal pressing tool 30 located above the substrate 5. The second terminal 36 is connected to a power supply means 38 through a second wire 39 and also linked to the rod 37a of a cylinder 37 which is fixed to the index mechanism 6 and serves as a switching means. When the cylinder 37 is activated and the rod 37a is moved upward, the second terminal 36 is made to contact with the first terminal 32. Then, electric power is fed from the power supply 38 to the thermal pressing tool 30 through the second terminal 36 and first terminal 32. As illustrated in FIG. 2, first contacts 32a and 36a located opposite to each other and second contacts 32b and 36b also located opposite to each other are provided on the first terminal 32 and second terminal 36, respectively.

Figure 3:
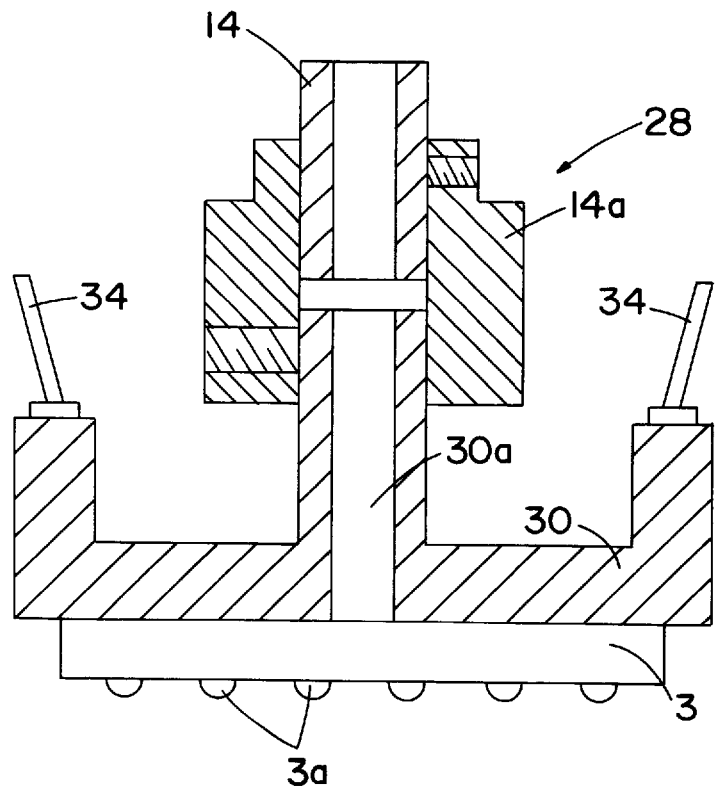
FIG. 3 and FIG. 4 are a cross-sectional view and a bottom view of a thermal pressing head for the bonding machine of FIG. 1, respectively.
Figure 4:
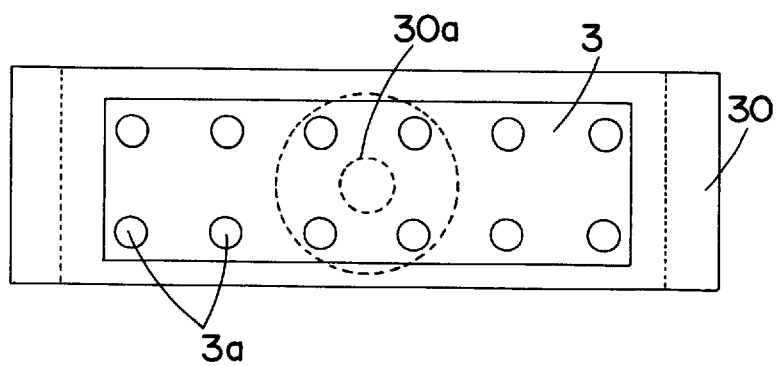

FIG. 3 and FIG. 4 are a cross-sectional view and a bottom view of the thermal pressing head 28, respectively. A suction hole 30a leading to a tube 40 serving as a vacuum channel as shown in FIG. 1 is formed in the center of the thermal pressing tool 30 to pick up the flip chip devices 3 by suction. The up-and-down rod 14 is linked to the thermal pressing tool 30 by means of a joint 14a formed of an insulator. Therefore, the electric current from the first wire 34 flows only in the thermal pressing tool 30 and does not flow in the up-and-down rod 14.

Next, how the bonding machine in the first exemplary embodiment performs will be explained. First, the motor 7 is driven to rotate the turntable 9, thereby one of the thermal pressing heads 28 and 29 being moved towards the above of the tray positioning means 1. FIG. 1 shows the state wherein the thermal pressing head 29 has been moved above the tray positioning means 1.

After that, a flip chip device 3 to be picked up by suction is brought to a position just below the thermal pressing head 29 by moving the tray positioning means 1 in X and Y directions. The up-and-down rod 15 is then moved down by activating the driving member 27 and the flip chip device 3 is picked up by the thermal pressing head 29. Then, the turn table 9 is rotated by 180° and the thermal pressing head 29 is moved towards the above of the substrate 5. At this time, the first terminal 33 is also moved above the second terminal 36.

The second terminal 36 is then made to contact the first terminal 33 by activating the cylinder 37. After that, an electric current is fed from the power supply 38 to heat the thermal pressing tool 31. In addition, the substrate positioning means 4 is driven around the same time as the cylinder 37 is activated to position properly the substrate 5 so that the flip chip device 3 can be mounted on a specified place of the substrate 5.

Next, the thermal pressing head 29 is moved down by activating the driving member 27 and the flip chip device 3 is mounted on a specified place of the substrate 5. The flip chip device 3 is bonded on the substrate 5 by the heat from the thermal pressing tool 31 and by the pressing force of the spring 19. Upon completion of the bonding, the thermal pressing head 29 is lifted and the second terminal 36 is separated from the first terminal 33. Further, the thermal pressing head 29 is moved away from the above of the substrate 5 by rotating the turntable 9. By following the same steps as above, another flip chip device 3 is mounted on the substrate 5 by means of the thermal pressing head 28.

Figure 5:
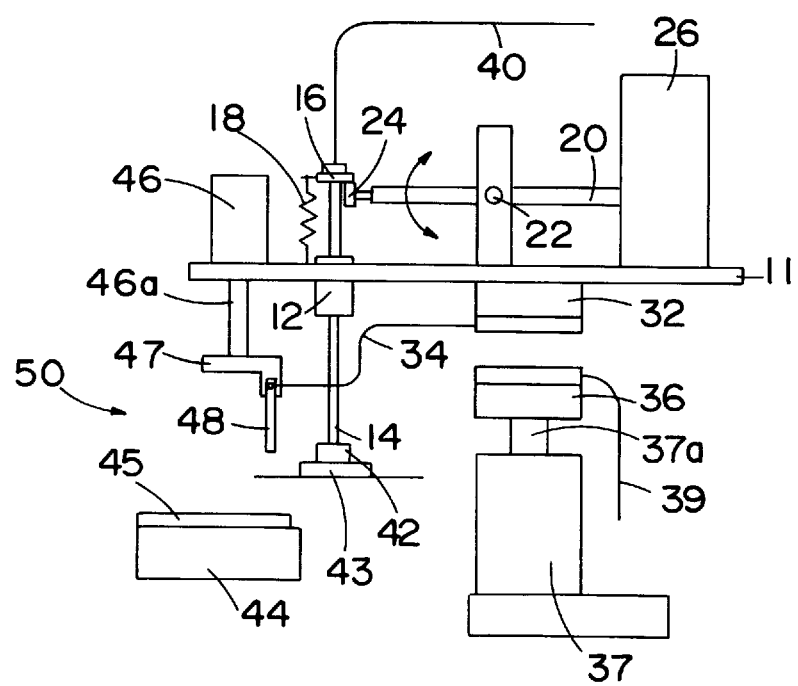
FIG. 5 is a side view of a bonding machine in a second exemplary embodiment of the present invention.
Figure 6:
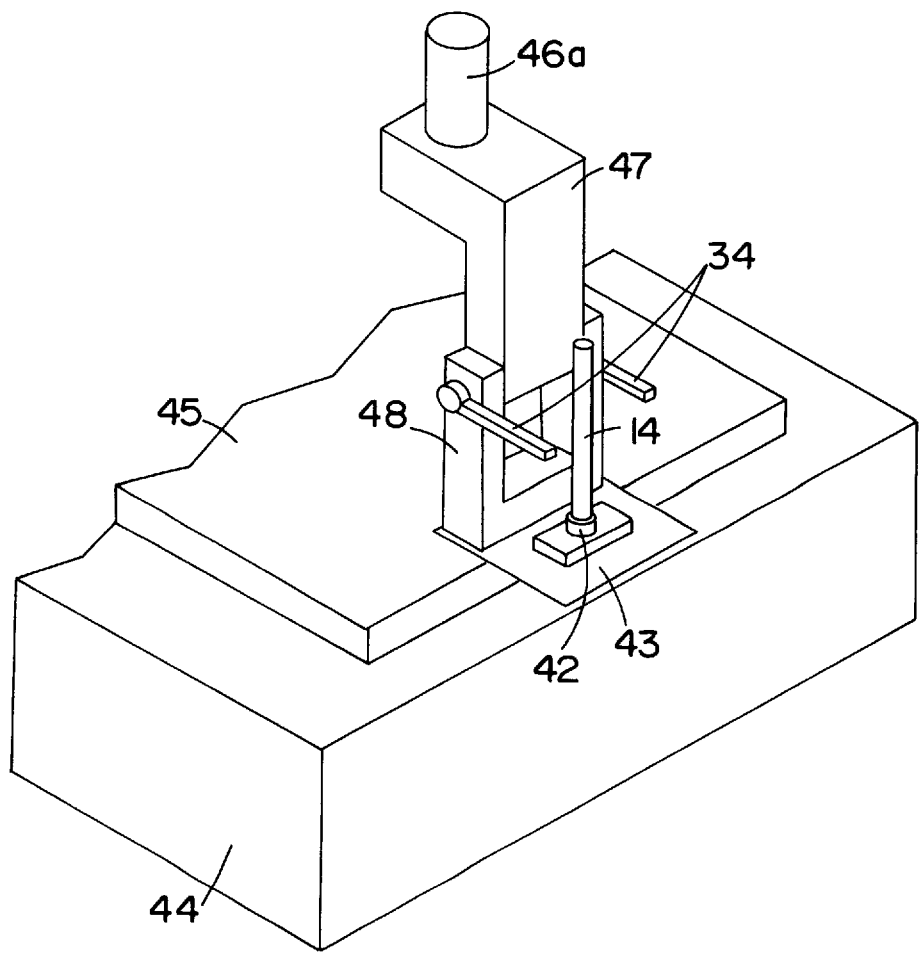
FIG. 6 is a perspective view of a thermal pressing head for the bonding machine of FIG. 5.

A second exemplary embodiment of the present invention will be explained with reference to FIG. 5 and FIG. 6. The second exemplary embodiment relates to a bonding machine whereby a tape carrier packaged (abbreviated as TPC hereunder) device having many leads around its periphery is mounted on a substrate such as a liquid crystal display substrate or the like through a thermal pressing of the leads on the substrate. The structure of the bonding machine in the second exemplary embodiment is basically the same as that in the first exemplary embodiment except for the thermal pressing head, and the explanation here is focused mainly on the thermal pressing head, omitting the explanation on other parts of the bonding machine.

The thermal pressing head 50 as used in the bonding machine of the second exemplary embodiment has a nozzle 42 provided on the lower end of an up-and-down rod 14 to pick up a TPC device 43 by suction. The position of a liquid crystal display substrate 45, on which the TPC device 43 is to be mounted, is fixed by a substrate positioning means 44. On the tip end of an arm 11 is fixed a cylinder 46, the rod 46a of which has a bracket 47 for holding a thermal pressing tool 48 linked to the lower end thereof. In the thermal pressing head 50, the nozzle 42 for holding electronic components and the thermal pressing tool 48 for thermal pressing are constructed independently from each other.

Next, an explanation will be made on how the bonding machine in the second exemplary embodiment performs. First, as was in the first exemplary embodiment, the arm 11 is rotated and the nozzle 42 is moved above a tray positioning means. The nozzle 42 is moved down to pick up a TPC device 43 and then the nozzle 42 is lifted. After that, as shown in FIG. 5, the nozzle 42 holding the TPC device 43 is moved towards the above of the substrate 45 and at the same time a first terminal 32 is moved to a place where the first terminal 32 can come into contact with a second terminal 36. The position of the substrate 45 is determined in advance by a substrate positioning means 44 so that the TCP device 43 is bonded on a specified place of the substrate 45.

Next, the nozzle 42 is moved down by activating a driving member 26 and the TPC device 43 is placed on the substrate 45. The first terminal 32 is brought into contact with the second terminal 36 by activating a cylinder 37, thereby the thermal pressing tool 48 being heated by an electric current flowing therein. Further, leads of the TPC device 43 are pressed down on the substrate 45 by the thermal pressing tool 48 and bonding is performed when the cylinder 46 is activated. After that, the thermal pressing tool 48 and nozzle 42 are moved up, and at the same time the second terminal 36 is separated from the first terminal 32, and finally the nozzle 42 is moved away from the above of the substrate 45.

The bonding machines in both the first and second exemplary embodiments described in the above do not use slip rings and any dusts due to rotational sliding of brushes are not produced. Moreover, electrical contact is established between the first terminal and the second terminal and there are no particular limits imposed on the amount of electric current and no danger of breakage of wires due to twisting by rotation, either.

It is needless to say that the present invention is not limited to the foregoing exemplary embodiments and may cover a variety of other exemplary embodiments. For example, although a bonding machine having two thermal pressing heads was described in the foregoing exemplary embodiment, the bonding machine may be provided with more than two thermal pressing heads. Although a thermal pressing head was used as the method for mounting electronic components on a substrate in the preferred embodiments described in the above, other processing methods than the one using a thermal pressing head can be employed. Therefore, any variations can be deemed to be included in the scope of what is claimed by the present invention as far as the variations abide by the true spirit of the present invention and stay within the scope thereof.

What is claimed is:

1. A method for bonding electronic components to a substrate comprising the steps of:
   a) positioning a tool to a loading position above an electronic component wherein a first terminal which supplies electric current to said tool is positioned concurrently;
   b) holding said component by said tool;
   c) concurrently moving a) said tool from said loading position toward a substrate and b) said first terminal at an installation position occupied by a second terminal;
   d) supplying electric current to said first terminal when said first terminal comes in contact with said second terminal so as to supply electric current to said tool;
   e) bonding said component on said substrate by means of said tool energized with electricity;
   f) releasing said electronic component from said head, and
   g) moving said head away from said substrate.

2. An apparatus for bonding electronic components to a substrate comprising:
   a plurality of arms each for moving a plurality of electronic components from at least one loading position to an installation position;
   a plurality of processors, each coupled to a respective one of said plurality of arms, for bonding said plurality of electronic components to said substrate;
   a plurality of first terminals, each one of said plurality of first terminals coupled to a respective one of said plurality of arms for supplying electric current to a respective one of said plurality of processors;
   a second terminal for supplying electric current to one of said respective first terminals, and;
   indexing means for:
      rotatably moving each of said arms and each of said respective first terminals from said loading position to said installation position,
      moving said second terminal into contact with said respective first terminals for supplying electric current to said any of said first terminals in said installation position,
      moving each of said electronic component into contact with said substrate at said installation position for bonding said electronic components to said substrate.

3. A method for bonding electronic components to a substrate comprising the steps of:
   holding an electronic component by a thermal pressing head having a thermal pressing tool;
   concurrently positioning said thermal pressing head and a respective first terminal connected electrically to said thermal pressing tool to an installation position where said thermal pressing head is above said substrate and said first terminal is aligned with a second terminal;
   bringing said first terminal and second terminal into contact with each other to supply electric current to said thermal pressing tool;
   bonding said electronic component onto said substrate by means of said thermal pressing tool;
   separating said second terminal and said first terminal;
   releasing said electronic component from said thermal pressing tool; and
   removing said thermal pressing head from the substrate.

4. A machine for bonding electronic components to a substrate and for use with an electric power supply comprising:
   substrate positioning means for fixing the position of the substrate;
   a plurality of processing means for bonding the electronic components to the substrate upon receipt of electric current;
   a rotating member coupled to an end of each one of said plurality of processing means;

driving means for positioning any one of said plurality of processing means, above the substrate;

a plurality of first terminals, each of which is arranged on said rotating member so as to correspond in position with a respective one of said processing means and electrically connected with each respective processing means;

a second terminal connected to the electric power supply and held independently from said rotating member and positioned in relation to a respective one of said first terminals; and switching means for connecting and disconnecting said respective one of said first terminals to said second terminal for supplying electric current to any one of said plurality of processing means positioned above the substrate.

5. The machine for bonding electronic components according to claim 4, wherein each of said plurality of processing means has a thermal pressing head including a thermal pressing tool.

6. The machine for bonding electronic components according to claim 5, wherein said thermal pressing tool includes a tool for thermal pressing bumps onto the substrate, said bumps being provided on a bottom surface of a flip chip device.

7. The machine for bonding electronic components according to claim 5, wherein said thermal pressing tool includes a tool for thermal pressing leads onto the substrate, said leads being provided on a periphery of a tape carrier packaged device.

* * * * *